(12) United States Patent
Kim

(10) Patent No.: US 10,892,310 B2
(45) Date of Patent: Jan. 12, 2021

(54) DISPLAY DEVICE INCLUDING A PASSIVATION LAYER HAVING AN UNEVEN SURFACE

(71) Applicant: SAMSUNG DISPLAY CO., LTD., Yongin-si (KR)

(72) Inventor: Jin Hyung Kim, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/690,854

(22) Filed: Nov. 21, 2019

(65) Prior Publication Data
US 2020/0091261 A1  Mar. 19, 2020

Related U.S. Application Data

(62) Division of application No. 15/708,220, filed on Sep. 19, 2017, now Pat. No. 10,504,979.

(30) Foreign Application Priority Data

Sep. 21, 2016 (KR) .......................... 10-2016-0120777

(51) Int. Cl.
*H01L 31/101* (2006.01)
*H01L 21/00* (2006.01)
(Continued)

(52) U.S. Cl.
CPC ...... *H01L 27/3258* (2013.01); *H01L 23/3171* (2013.01); *H01L 27/3276* (2013.01); (Continued)

(58) Field of Classification Search
CPC .......................................................... H01L 33/44
(Continued)

(56) References Cited

U.S. PATENT DOCUMENTS 8,030,838 B2 * 10/2011 Kwak ................. H01L 27/3246
313/500
8,231,423 B2 7/2012 Chan et al.
(Continued)

FOREIGN PATENT DOCUMENTS

| JP | 2011-077064 | 4/2011 |
|---|---|---|
| KR | 10-2008-0076459 | 8/2008 |
| KR | 10-1233348 | 2/2013 |

*Primary Examiner* — Calvin Lee
(74) *Attorney, Agent, or Firm* — F. Chau & Associates, LLC

(57) ABSTRACT

A display device includes a substrate, a transistor, a pad portion, a passivation layer, and a pixel definition layer. The substrate includes a display area and a peripheral area disposed at an edge of the display area. The transistor is disposed on the display area. The pad portion is disposed on the peripheral area. The passivation layer is disposed on the transistor. The pixel definition layer is disposed on the passivation layer. A portion of the passivation layer extends to the peripheral area. An upper surface of the portion of the passivation layer disposed on the display area is substantially flat. An upper surface of the portion of passivation layer disposed at the peripheral area has an uneven structure. The uneven structure includes a recess portion and a convex portion. The pixel definition layer covers the portion of the passivation layer disposed on the peripheral area.

8 Claims, 7 Drawing Sheets

(51) Int. Cl.
    *H01L 27/32*     (2006.01)
    *H01L 51/52*     (2006.01)
    *H01L 33/44*     (2010.01)
    *H01L 23/31*     (2006.01)

(52) U.S. Cl.
    CPC .......... *H01L 33/44* (2013.01); *H01L 51/5228* (2013.01); *H01L 51/5237* (2013.01); *H01L 51/5253* (2013.01); *H01L 27/3246* (2013.01); *H01L 51/5203* (2013.01); *H01L 51/5218* (2013.01)

(58) Field of Classification Search
    USPC .......................... 438/28, 69; 257/82, 98, 462
    See application file for complete search history.

(56) References Cited

U.S. PATENT DOCUMENTS

| | | | |
|---|---|---|---|
| 9,082,671 | B2 | 7/2015 | Jang et al. |
| 10,269,881 | B2 * | 4/2019 | Go ...................... H01L 27/3248 |
| 10,504,979 | B2 * | 12/2019 | Kim .................... H01L 51/5237 |
| 2013/0015457 | A1 | 1/2013 | You |
| 2016/0268356 | A1 | 9/2016 | Go et al. |
| 2017/0084674 | A1 | 3/2017 | Song et al. |
| 2018/0083083 | A1 | 3/2018 | Kim |

* cited by examiner

DISPLAY DEVICE INCLUDING A PASSIVATION LAYER HAVING AN UNEVEN SURFACE

CROSS-REFERENCE TO RELATED APPLICATIONS

This application claims priority under 35 U.S.C. § 121 to parent U.S. application Ser. No. 15/708,220 filed on Sep. 19, 2017, now U.S. Pat. No. 10,504,979 issued on Dec. 10, 2019, which claims priority under 35 U.S.C. § 119 to Korean Patent Application No. 10-2016-0120777 filed in the Korean Intellectual Property Office on Sep. 21, 2016, the disclosures of which are incorporated by reference herein in their entireties.

TECHNICAL FIELD

Exemplary embodiments of the present invention relate to a display device, and more particularly to a display device including a passivation layer having an uneven surface.

DISCUSSION OF RELATED ART

An organic light-emitting diode display includes two electrodes and an organic emission layer. The organic emission layer is disposed between the two electrodes. Electrons injected from one electrode and holes injected from the other electrode are coupled with each other in the organic emission layer. Thus, excitons are generated. The excitons emit light. The organic light-emitting diode display displays a predetermined image by using the emitted light.

The organic light-emitting diode display includes a plurality of pixels. Each of the plurality of pixels includes an organic light-emitting diode. The organic light-emitting diode is light-emitting. The organic light-emitting diode includes an anode, an emission layer, and a cathode.

The anode may include silver (Ag). Thus, the anode may have a relatively low resistance and a relatively high reflectance. During an etching process to form the anode, some silver (Ag) might not be properly removed. Thus, silver (Ag) particles may remain. The silver (Ag) particles may be transferred to a pad portion.

SUMMARY

Exemplary embodiments of the present invention provide a display device, in which a short circuit of a pad electrode of a pad portion as a result of an anode particle may be reduced or prevented.

A display device according to an exemplary embodiment of the present invention includes a substrate, a transistor, a pad portion, a passivation layer, and a pixel definition layer. The substrate includes a display area and a peripheral area. The peripheral area is disposed at an edge of the display area. The transistor is disposed on the display area of the substrate. The pad portion is disposed on the peripheral area of the substrate. The passivation layer is disposed on the transistor. The pixel definition layer is disposed on the passivation layer. A portion of the passivation layer extends to the peripheral area. An upper surface of the portion of the passivation layer disposed on the display area is substantially flat. An upper surface of the portion of the passivation layer disposed on the peripheral area has an uneven structure. The uneven structure includes a recess portion and a convex portion. The pixel definition layer covers the portion of the passivation layer disposed on the peripheral area.

A plurality of first electrode particles may be disposed at the recess portion of the uneven structure.

The display device may further include an organic light-emitting diode. The organic light-emitting diode may be disposed on the passivation layer. The organic light emitting diode may be connected to the transistor. The organic light emitting diode may include a first electrode, a light-emitting member, and a second electrode. The first electrode may be disposed on the passivation layer. The light-emitting member may be disposed on the first electrode. The second electrode may be disposed on the light-emitting member. The plurality of first electrode particles may include substantially the same material as the first electrode.

The pad portion may include a first pad electrode, a second pad electrode, and an auxiliary electrode. The second pad electrode may be disposed adjacent to the first pad electrode. The auxiliary electrode may be disposed between the first pad electrode and the second pad electrode.

An interlayer insulating layer having a groove may be disposed between the first pad electrode and the second pad electrode. The auxiliary electrode may be disposed in the groove.

The plurality of first electrode particles may be disposed on the auxiliary electrode.

The display device may further include a first wire, a second wire, and an auxiliary wire. The first wire may electrically connect the first pad electrode and the display area. The second wire may electrically connect the second pad electrode and the display area. The auxiliary wire may electrically connect the auxiliary electrode and the first wire. The first pad electrode may be configured to receive a driving voltage.

The display device may further include a covering layer. The covering layer may be disposed in the groove of the interlayer insulating layer. The covering layer may include substantially the same material as the pixel definition layer.

The transistor may include a semiconductor layer, a gate insulating layer, a gate electrode, a source electrode, and a drain electrode. The semiconductor layer may include a channel region, a source region, and a drain region. The gate insulating layer may be disposed on the semiconductor layer. The gate electrode may be disposed on the gate insulating layer. The source electrode may be connected to the source region. The drain electrode may be separated from the source electrode. The drain electrode may be connected to the drain region. The first pad electrode and the second pad electrode may respectively include a lower electrode layer and an upper electrode layer. The lower electrode layer may be disposed on the gate insulating layer. The upper electrode layer may be connected to the lower electrode layer. The upper electrode layer may be disposed on the interlayer insulating layer.

The auxiliary electrode may be disposed on the gate insulating layer. The auxiliary electrode may include substantially the same material as the lower electrode layer and the gate electrode.

The upper electrode layer may include substantially the same material as the source electrode and the drain electrode.

A display device according to an exemplary embodiment of the present invention includes a substrate, a transistor, and a pad portion. The substrate includes a display area and a peripheral area. The peripheral area is disposed at an edge of the display area. The transistor is disposed on the display area of the substrate. The pad portion is disposed on the peripheral area of the substrate. The pad portion includes a first pad electrode, a second pad electrode, and an auxiliary electrode. The second pad electrode is disposed adjacent to the first pad electrode. The auxiliary electrode is disposed between the first pad electrode and the second pad electrode. An interlayer insulating layer having a groove is disposed between the first pad electrode and the second pad electrode. The auxiliary electrode is disposed in the groove.

A plurality of first electrode particles may be disposed on the auxiliary electrode.

The display device may further include a passivation layer and a pixel definition layer. The passivation layer may be disposed on the transistor. The pixel definition layer may be disposed on the passivation layer. A portion of the passivation layer may extend to the peripheral area. An upper surface of the portion of the passivation layer disposed on the display area may be substantially flat. An upper surface of the portion of the passivation layer disposed on the peripheral area may have an uneven structure. The uneven structure may include a recess portion and a convex portion. The pixel definition layer may cover the portion of the passivation layer disposed on the peripheral area.

The plurality of first electrode particles may be disposed on the recess portion of the uneven structure.

An organic light-emitting diode may be disposed on the passivation layer. The organic light-emitting diode may be connected to the transistor. The organic light-emitting diode may include a first electrode, a light-emitting member, and a second electrode. The first electrode may be disposed on the passivation layer. The light-emitting member may be disposed on the first electrode. The second electrode may be disposed on the light-emitting member. The plurality of first electrode particles may include substantially the same material as the first electrode.

The display device may further include a first wire, a second wire, and an auxiliary wire. The first wire may electrically connect the first pad electrode and the display area. The second wire may electrically connect the second pad electrode and the display area. The auxiliary wire may electrically connect the auxiliary electrode and the first wire. The first pad electrode may be configured to receive a driving voltage.

The display device may further include a covering layer. The covering layer may fill the groove. The covering layer may include substantially the same material as the pixel definition layer.

The transistor may include a semiconductor layer, a gate insulating layer, a gate electrode, a source electrode, and a drain electrode. The semiconductor layer may include a channel region, a source region, and a drain region. The gate insulating layer may be disposed on the semiconductor layer. The gate electrode may be disposed on the gate insulating layer. The source electrode may be connected to the source region. The drain electrode may be separated from the source electrode and connected to the drain region. The first pad electrode and the second pad electrode may respectively include a lower electrode layer and an upper electrode layer. The lower electrode layer may be disposed on the gate insulating layer. The upper electrode layer may be connected to the lower electrode layer and disposed on the interlayer insulating layer.

The auxiliary electrode may be disposed on the gate insulating layer. The auxiliary electrode may include substantially the same material as the lower electrode layer and the gate electrode. The upper electrode layer may include substantially the same material as the source electrode and the drain electrode.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
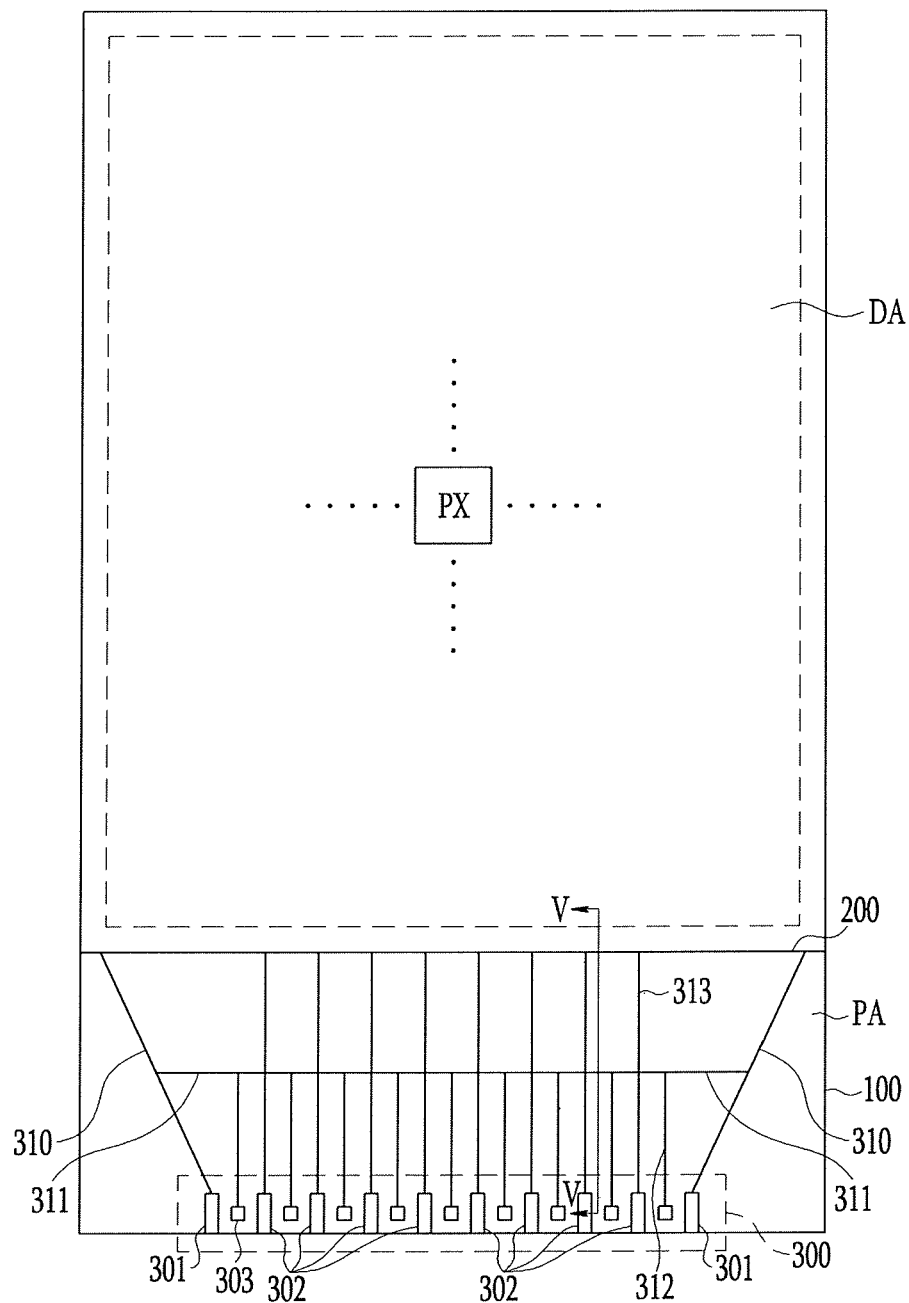
FIG. 1 is a top plan view illustrating a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements through the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or a plate, is referred to as being "on" another component, the component can be directly on the other component or intervening components may be present.

Figure 2:
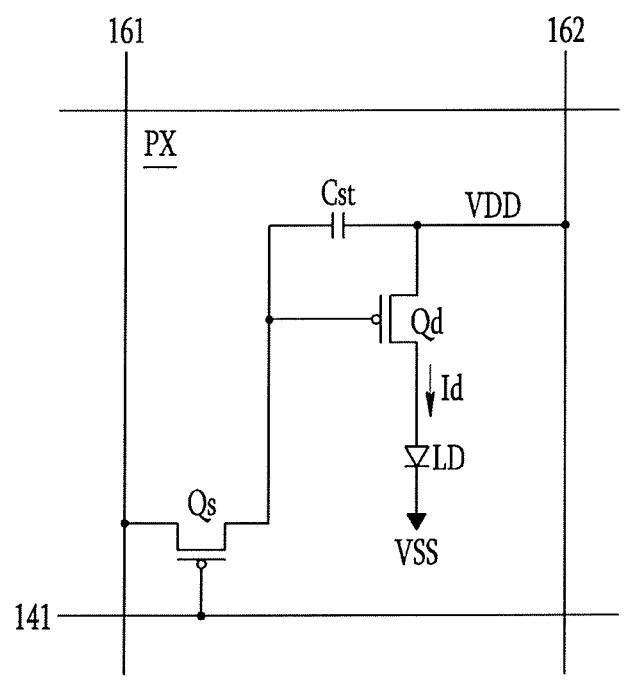
FIG. 2 is an equivalent circuit diagram illustrating a pixel of a display device of FIG. 1 according to an exemplary embodiment of the present invention.
Figure 3:
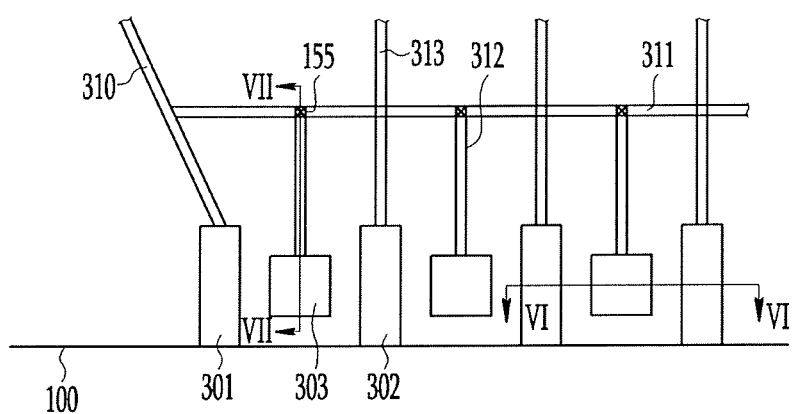
FIG. 3 is a top plan view illustrating a part of a pad portion of FIG. 1 according to an exemplary embodiment of the present invention.

FIG. 1 is a top plan view illustrating a display device according to an exemplary embodiment of the present invention. FIG. 2 is an equivalent circuit diagram of a pixel of a display device of FIG. 1 according to an exemplary embodiment of the present invention. FIG. 3 is a top plan view illustrating a part of a pad portion of FIG. 1 according to an exemplary embodiment of the present invention.

Referring to FIGS. 1 to 3, a display device 1000 may include a substrate 100. The substrate 100 may include a display area DA and a peripheral area PA. The display area DA may display an image. The peripheral area PA may be disposed at an edge of the display area DA. The display device 1000 may include an encapsulation substrate 200 and a pad portion 300. The encapsulation substrate 200 may cover the display area DA. The pad portion 300 may be disposed at the peripheral area PA of the substrate 100. The display device 1000 may include a first wire 310 and a second wire 313. The first wire 310 and the second wire 313 may each be disposed at the peripheral area PA of the substrate 100. The first wire 310 and the second wire 313 may each connect the pad portion 300 to the display area DA of the substrate 100.

A plurality of pixels PX may be disposed on the display area DA. The plurality of pixels PX may be arranged, for example, in a matrix shape; however, exemplary embodiments of the present invention are not limited thereto. Each pixel PX may be connected to each of a plurality of signal lines 141, 161, and 162.

The signal lines 141, 161, and 162 may include gate lines 141, data lines 161, and driving voltage lines 162. The gate lines 141 may transmit a gate signal or a scan signal. The data lines 161 may transmit a data signal. The gate lines 141 may transmit a driving voltage VDD.

The gate lines 141 may extend substantially in a row direction, e.g., a horizontal direction. The gate lines 141 may be substantially parallel to each other. The data lines 161 and the driving voltage lines 162 may each extend substantially in a column direction, e.g., a vertical direction. The data lines 161 and the driving voltage lines 162 may be substantially parallel to each other.

The pixel PX may include a switching transistor Qs, a driving transistor Qd, a storage capacitor Cst, and an organic light-emitting diode LD.

The switching transistor Qs may include a control terminal, an input terminal, and an output terminal. The control terminal may be connected to the gate line 141. The input terminal may be connected to the data line 161. The output terminal may be connected to the driving transistor Qd. The switching transistor Qs may transmit the data signal applied to the data line 161 to the driving transistor Qd, for example, according to the gate signal applied to the gate line 141.

The driving transistor Qd may include a control terminal, an input terminal, and an output terminal. The control terminal may be connected to the switching transistor Ti. The input terminal may be connected to the driving voltage line 162. The output terminal may be connected to the organic light-emitting diode LD. The driving transistor Qd may transfer an output current Id. A magnitude of the output current Id may vary, for example, according to a voltage applied between the control terminal and the output terminal.

The capacitor Cst may be connected to each of the control terminal and the input terminal of the driving transistor Qd. The capacitor Cst may charge the data signal applied to the control terminal of the driving transistor Qd. The capacitor Cst may maintain the charged data signal when the switching transistor Qs is turned off.

The organic light-emitting diode LD may include an anode and a cathode. The anode may be connected to the output terminal of the driving transistor Qd. The cathode may be connected to a common voltage VSS. The organic light-emitting diode LD may displays an image, for example, by differentiating an intensity thereof according to the output current Id of the driving transistor Qd.

The switching transistor Qs and the driving transistor Qd may each be an n-channel electric field effect transistor (FET) or a p-channel electric field effect transistor. A connection relation of the switching and driving transistors Qs and Qd, the storage capacitor Cst, and the organic light-emitting diode LD may vary.

The pad portion 300 may include a plurality of pad electrodes and an auxiliary electrode 303. The auxiliary electrode 303 may be disposed between adjacent pad electrodes. The plurality of pad electrodes may include a plurality of first pad electrodes 301 and a plurality of second pad electrodes 302.

The first pad electrode 301 may receive the driving voltage from an external source. The first pad electrode 301 may transmit the driving voltage to the driving voltage line 162 of the display area DA. The first pad electrode 301 may be disposed at side surfaces of the pad portion 300. Each first pad electrode 301 may be connected to the display area DA, for example, by the first wire 310. A connection wire 311 may be disposed between the pad portion 300 and the display area DA. The connection wire 311 may connect the first wires 310 to each other. According to an exemplary embodiment of the present invention, the pad portion 300 may include at least two first pad electrodes 301.

The plurality of second pad electrodes 302 may be disposed between adjacent first pad electrodes 301. The second pad electrode 302 may receive the driving signal or the common voltage to be transmitted to the display area DA. Each second pad electrode 302 may be connected to the display area DA, for example, by the second wires 313.

The auxiliary electrode 303 may be disposed between the first pad electrode 301 and the second pad electrode 302. The auxiliary electrode 303 may be disposed between adjacent second pad electrodes 302. The auxiliary electrode 303 may be connected to the connection wire 311, for example, by auxiliary wires 312. Thus, a driving voltage may be applied to the auxiliary electrode 303. The auxiliary wire 312 may be connected to the connection wire 311, for example, through a wire contact hole 155.

The structure of the display device according to FIG. 1 will be described in more detail below with reference to FIGS. 4 to 7.

Figure 4:
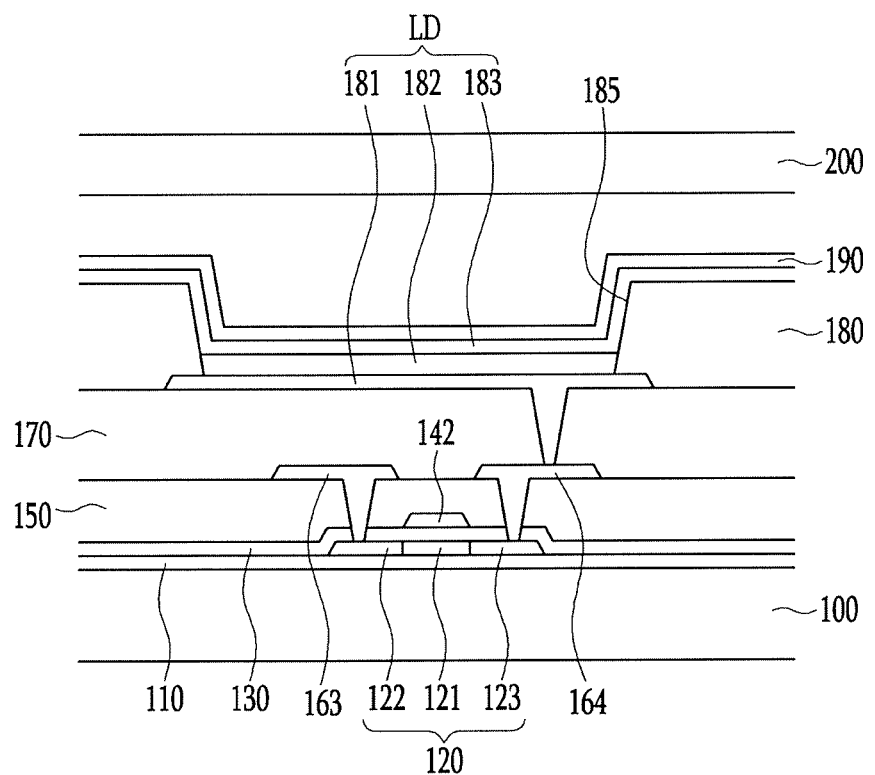
FIG. 4 is a cross-sectional view illustrating a pixel of a display device of FIG. 1 according to an exemplary embodiment of the present invention.
Figure 5:
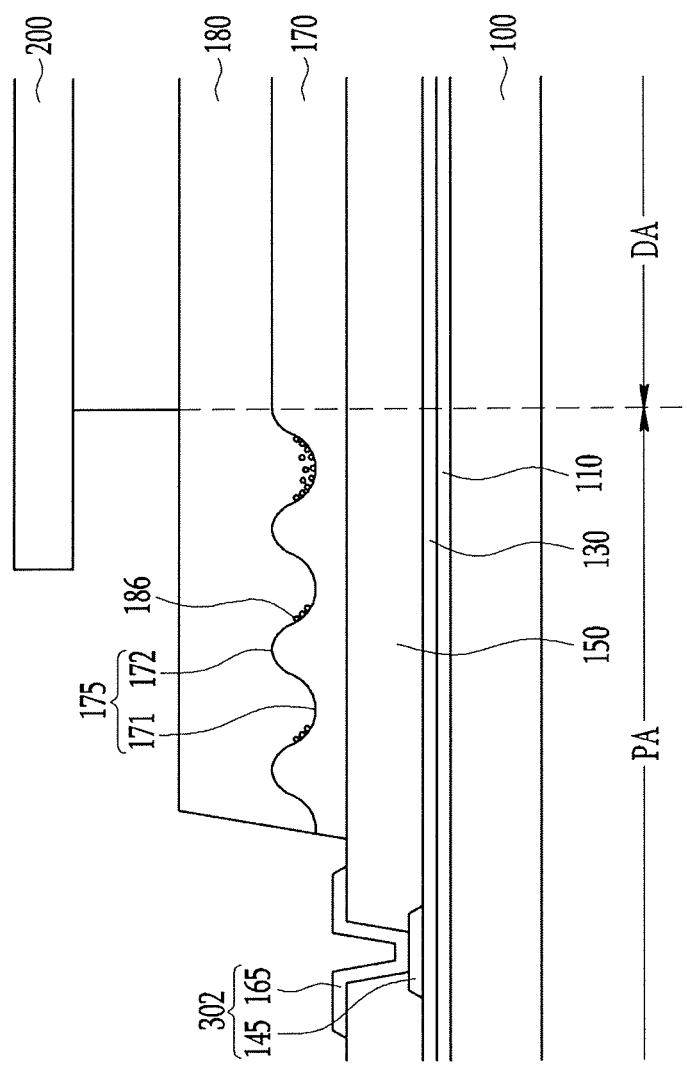
FIG. 5 is a view illustrating a cross-section taken along a line V-V of FIG. 1 according to an exemplary embodiment of the present invention.
Figure 6:
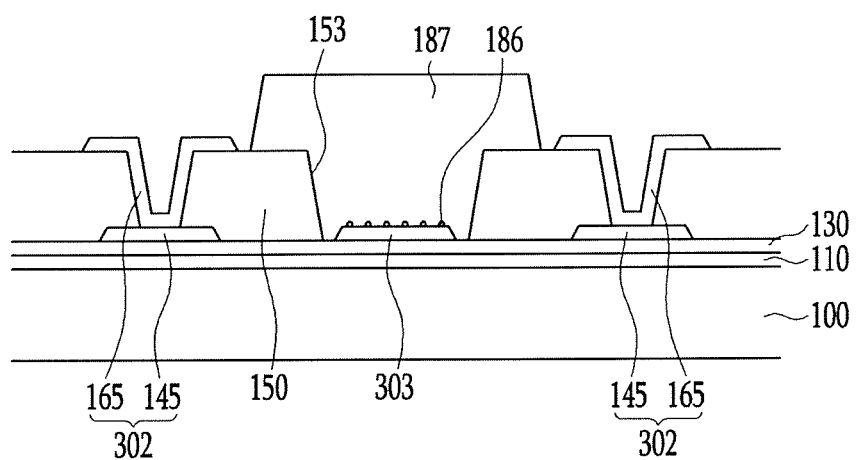
FIG. 6 is a view illustrating a cross-section taken along a line VI-VI of FIG. 3 according to an exemplary embodiment of the present invention.
Figure 7:
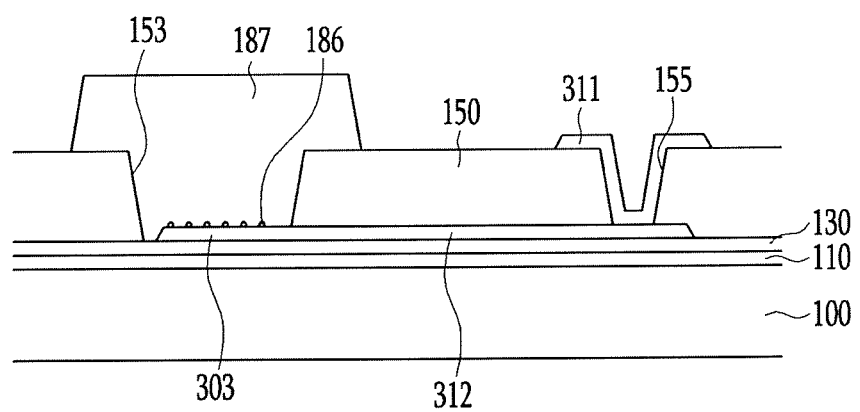
FIG. 7 is a view illustrating a cross-section taken along a line VII-VII of FIG. 3 according to an exemplary embodiment of the present invention.

FIG. 4 is a cross-sectional view illustrating a pixel of a display device shown in FIG. 1 according to an exemplary embodiment of the present invention. FIG. 5 is a view illustrating a cross-section taken along a line V-V of FIG. 1 according to an exemplary embodiment of the present invention. FIG. 6 is a view illustrating a cross-section taken along a line VI-VI of FIG. 3 according to an exemplary embodiment of the present invention. FIG. 7 is a view illustrating a cross-section taken along a line VII-VII of FIG. 3 according to an exemplary embodiment of the present invention.

Referring to FIG. 4, a display device may include a buffer layer 110. The buffer layer 110 may be disposed on the substrate 100.

The substrate 100 may be a transparent insulating substrate. The transparent insulating substrate may include glass, quartz, ceramic, or plastic. The substrate 100 may be a metallic substrate. The metallic substrate may include stainless steel.

The buffer layer 110 may have a single layered structure. The single layered structure may include a silicon nitride (SiNx). Alternatively, the buffer layer 110 may have a multi-layered structure, for example, a dual-layered structure. The dual-layered structure may include a silicon nitride (SiNx) and a silicon oxide (SiOx). The buffer layer 110 may planarize a surface of the substrate 100. The buffer layer 100 may reduce or prevent materials such as impurities or moisture from permeating into the display device.

A semiconductor layer 120 may be disposed on the buffer layer 110. The semiconductor layer 120 may include a channel region 121, a source region 122, and a drain region 123. The source region 122 and the drain region 123 may be disposed at respective sides of the channel region 121.

The semiconductor layer 120 may include a polycrystalline silicon. For example, the channel region 121 may include a polycrystalline silicon. The polycrystalline silicon might not be doped with an impurity. Thus, the channel region 121 may be an intrinsic semiconductor. The source region 122 and the drain region 123 may each include a polycrystalline silicon that is doped with a conductive impurity. Thus, the source region 122 and the drain region 123 may each be an impurity semiconductor.

A gate insulating layer 130 may be disposed on each of the buffer layer 110 and the semiconductor layer 120. The gate insulating layer 130 may have a single layered structure. Alternatively, the gate insulating layer 130 may have a multi-layered structure. The gate insulating layer 130 may include at least one of a silicon nitride or a silicon oxide.

A gate electrode 142 may be disposed on the gate insulating layer 130. The gate electrode 142 may be connected to the gate line 141 of FIG. 2. The gate electrode 142 may overlap the channel region 121.

An interlayer insulating layer 150 may be disposed on each of the gate insulating layer 130 and the gate electrode 142. The interlayer insulating layer 150 may have a single layered structure. Alternatively, the interlayer insulating layer 150 may have a multi-layered structure. The interlayer insulating layer 150 may include at least one of a silicon nitride or a silicon oxide.

A source electrode 163 and a drain electrode 164 may each be disposed on the interlayer insulating layer 150. The source electrode 163 may be connected to the source region 122. The drain electrode 164 may be connected to the drain region 123. The source electrode 163 may be separated from the drain electrode 164. The source electrode 163 may be connected to the driving voltage line 162 of FIG. 2. The source electrode 163 and the drain electrode 164 may each include aluminum (Al) or molybdenum (Mo).

The semiconductor layer 120, the gate electrode 142, the source electrode 163, and the drain electrode 164 may together form a transistor. The transistor may be the driving transistor Qd. Accordingly, the gate electrode 142 may be connected to the gate line 141, for example, through the switching transistor Qs.

A passivation layer 170 may be disposed on each of the interlayer insulating layer 150, the source electrode 163, and the drain electrode 164. The passivation layer 170 may include an organic material. An upper surface of the passivation layer 170 may be substantially flat.

An organic light-emitting diode LD and a pixel definition layer 180 may each be disposed on the passivation layer 170.

The organic-light emitting diode LD may include a first electrode 181, a light-emitting member 182, and a second electrode 183.

The first electrode 181 may be disposed on the passivation layer 170. The first electrode 181 may be connected to the drain electrode 164. The first electrode 181 may be an anode of the organic light-emitting diode LD. The first electrode 181 may include a reflective layer. The first electrode 181 may include at least one of silver (Ag), magnesium (Mg), gold (Au), calcium (Ca), lithium (Li), chromium (Cr), or alloys thereof. The first electrode 181 may include silver (Ag). Accordingly, the first electrode 181 may have a relatively low resistance and a relatively high reflectance.

The pixel definition layer 180 may be disposed on an edge of each of the first electrode 181 and the passivation layer 170. The pixel definition layer 180 may include an opening 185. The opening 185 may overlap the first electrode 181.

The light-emitting member 182 may be disposed on the first electrode 181, for example, in the opening 185 of the pixel definition layer 180. The light-emitting member 182 may have a multi-layered structure. The multi-layered structure may include one or more selected from an emission layer, a hole-injection layer (HIL), a hole-transporting layer (HTL), an electron-transporting layer (ETL), or an electron-injection layer (EIL). When the light-emitting member 182 includes an emission layer, a HIL, a HTL, an ETL, and an EIL, the hole-injection layer may be disposed on the first electrode 181 as the anode. The hole-transporting layer, the emission layer, the electron-transporting layer, and the electron-injection layer may be sequentially stacked on the first electrode 181.

The light-emitting member 182 may include a red-emitting layer t, a green-emitting layer, and a blue-emitting layer. The red-emitting layer may emit red light. The green-emitting layer may emit green light. The blue-emitting layer may emit blue light. The red-emitting layer, the green-emitting layer, and the blue-emitting layer may be respectively disposed on a red pixel, a green pixel, and a blue pixel, for example, to provide a color image.

The red organic emission layer, the green organic emission layer, and the blue organic emission layer may be integrally stacked on the light-emitting member 182 with the red pixel, the green pixel, and the blue pixel. Therefore, a red color filter, a green color filter, and a blue color filter may be formed in each pixel, for example, to provide a color image. Alternatively, a white organic emission layer may be formed on each of the red pixel, the green pixel, and the blue pixel. The white organic emission layer may emit white light. A red color filter, a green color filter, and a blue color filter may be respectively formed for each pixel, for example, to provide a color image. When the color image is provided using the white organic emission layer and the color filter, a deposition mask for depositing each of the red organic emission layer, the green organic emission layer, and the blue organic emission layer on individual pixels (i.e., the red pixel, the green pixel, and the blue pixel) may be omitted.

The white organic emission layer may have a single organic emission layer. The white organic emission layer may include a structure including a plurality of stacked organic emission layers, for example, to emit white light. For example, at least one yellow organic emission layer and at least one blue organic emission layer may be combined to emit white light. At least one cyan organic emission layer and at least one red organic emission layer may be combined to emit white light. At least one magenta organic emission layer and at least one green organic emission layer may be combined to emit white light.

The second electrode 183 may be disposed on each of the pixel definition layer 180 and the light emitting member 182. The second electrode 183 may include a transparent conductive material such as ITO, IZO, ZnO, or $In_2O_3$. The second electrode 183 may be the cathode of the organic light-emitting diode LD.

A capping layer 190 may be disposed on the second electrode 183. The capping layer 190 may protect the organic light-emitting diode LD. The capping layer 190 may also increase external emission of light generated in the light-emitting member 182.

An encapsulation substrate 200 may be disposed on the capping layer 190. The encapsulation substrate 200 may be combined with the substrate 100, for example, by a sealant. Thus, the encapsulation substrate 200 may have a function of encapsulation. The encapsulation substrate 200 and the organic light-emitting diode LD may be separated from each other. A filler may be disposed in a space between the encapsulation substrate 200 and the organic light-emitting diode LD. The filler may fill an empty space inside the organic light-emitting diode display. Thus a strength and durability of the organic light-emitting diode display may be increased.

Alternatively, a spacer may be disposed between the substrate 100 and the encapsulation substrate 200. The spacer may maintain an interval between the substrate 100 and the encapsulation substrate 200.

Referring to FIG. 5, the buffer layer 110, the gate insulating layer 130, the interlayer insulating layer 150, the passivation layer 170, and the pixel definition layer 180 disposed on the substrate 100 may each extend from the display area DA to the peripheral area PA.

A second pad electrode 302 may be disposed on the peripheral area PA. The second pad electrode 302 may include a lower electrode layer 145 and an upper electrode layer 165. The lower electrode layer 145 may be disposed on the gate insulating layer 130. The upper electrode layer 165 may be disposed on the interlayer insulating layer 150. The upper electrode layer 165 may contact the lower electrode layer 145. The lower electrode layer 145 may include substantially the same material as the gate electrode 142. The upper electrode layer 165 may include substantially the same material as the source electrode 163 and the drain electrode 164. The first pad electrode 301 may have substantially the same structure as the second pad electrode 302.

The passivation layer 170 and the pixel definition layer 180 disposed on the peripheral area PA might not cover the second pad electrode 302.

The upper surface of the passivation layer 170 disposed on the peripheral area PA may have a protrusions and depressions structure 175. The protrusions and depressions structure 175 may include a recess portion 171 and a convex portion 172. A plurality of first electrode particles 186 may be disposed in the recess portion 171. The first electrode particles 186 may include substantially the same material as the first electrode 181.

When forming the passivation layer 170, a half-tone mask or a slit mask may be used. Accordingly, the passivation layer 170 may be formed so the upper surface of the passivation layer 170 disposed at the display area DA may be substantially flat. The passivation layer 170 may be formed so the upper surface of the passivation layer 170 disposed at the peripheral area PA may have the protrusions and depressions structure 175.

The pixel definition layer 180 may be disposed on the passivation layer 170 disposed at the display area DA. The pixel definition layer 180 may also be disposed on the passivation layer 170 disposed at the peripheral area PA. Accordingly, the pixel definition layer 180 may cover the first electrode particles 186 disposed at the protrusions and depressions structure 175 of the passivation layer 170.

Referring to FIGS. 6 and 7, the interlayer insulating layer 150 disposed between adjacent second pad electrodes 302 may have a groove 153. The auxiliary electrode 303 may be disposed in the groove 153. The auxiliary electrode 303 may be disposed on the gate insulating layer 130. The cross-sectional structure between adjacent second pad electrodes 302 of FIG. 6 may be substantially the same as the cross-sectional structure between the first pad electrode 301 and the second pad electrode 302 adjacent to each other of FIG. 7.

The plurality of first electrode particles 186 may be disposed on the auxiliary electrode 303. A covering layer 187 may be disposed in the groove 153. For example, the groove 153 may be filled with the covering layer 187. The covering layer 187 may cover the first electrode particles 186 disposed on the auxiliary electrode 303. The connection wire 311 may be disposed on the interlayer insulating layer 150. The auxiliary electrode 303 may be connected to the auxiliary wire 312. The auxiliary wire 312 may be connected to the connection wire 311, for example, through the wire contact hole 155 disposed at the interlayer insulating layer 150.

The auxiliary electrode 303 and the auxiliary wire 312 may each include substantially the same material as the lower electrode layer 145 of the second pad electrode 302. The connection wire 311 may include substantially the same material as the upper electrode layer 165 of the second pad electrode 302. The covering layer 187 may include substantially the same material as the pixel definition layer 180.

The connection wire 311 may be covered by the passivation layer 170.

The first electrode 181 disposed on the passivation layer 170 may be formed by depositing a metal layer and etching the metal layer, for example, through wet etching. The metal layer may include silver (Ag). During the wet etching, silver (Ag) removed by an etchant may receive an electron from the metal included in each of the first pad electrode 301 and the second pad electrode 302. Thus, a part of silver (Ag) might not be properly removed and may be reduced into silver (Ag) particles. Accordingly, the silver (Ag) particles may be absorbed between the pad portion 300 and the display area DA. The absorbed silver (Ag) particles may move into the pad portion 300 in another process. The silver (Ag) particles may be transferred to each of the first pad electrode 301 and the second pad electrode 302. Accordingly, the first pad electrode 301 and the second pad electrode 302 may be shorted to each other.

According to an exemplary embodiment of the present invention, since the upper surface of the passivation layer 170 disposed at the peripheral area PA may have the protrusions and depressions structure 175, the first electrode particle 186 absorbed to the passivation layer 170 may substantially remain at the recess portion 171. Thus, diffusion to the pad portion 300 may be reduced or prevented.

As the protrusions and depressions structure 175 of the passivation layer 170 is covered by the pixel definition layer 180, the first electrode particle 186 absorbed to the passivation layer 170 may be prevented from being moved to the pad portion 300. Accordingly, a short circuit of each of the first pad electrode 301 and the second pad electrode 302 may be reduced or prevented.

Since the first electrode particle 186 may be absorbed to the auxiliary electrode 303 disposed in the groove 153 of the interlayer insulating layer 150 disposed between adjacent second pad electrodes 302 and between the first pad electrode 301 and the second pad electrode 302 adjacent to each other, the first electrode particle 186 may be prevented from being transferred to each of the first pad electrode 301 and the second pad electrode 302.

Since the covering layer 187 may cover the first electrode particle 186 absorbed to the auxiliary electrode 303, the first electrode particle 186 may be prevented from being transferred to each of the first pad electrode 301 and the second pad electrode 302 in another process. Accordingly, a short circuit in each of the first pad electrode 301 and the second pad electrode 302 may be reduced or prevented.

In the display device 1000 according to an exemplary embodiment of the present invention, the upper surface of the passivation layer 170 disposed at the peripheral area PA may have the protrusions and depressions structure 175 in the pad portion 300. The auxiliary electrode 303 may be disposed in the groove 153 of the interlayer insulating layer 150 disposed between adjacent second pad electrodes 302 and between the first pad electrode 301 and the second pad electrode 302 adjacent to each other; however exemplary embodiments of the present invention are not limited thereto. For example, the protrusions and depressions structure 175 of the passivation layer 170 and the structure in which the auxiliary electrode 303 is disposed and the groove 153 may be an exemplary embodiment of the present invention.

In the display device 1000 according to an exemplary embodiment of the present invention, the upper surface of the passivation layer 170 disposed at the peripheral area PA may have the protrusions and depressions structure 175; however the auxiliary electrode 303 might not be disposed in the pad portion 300. In the display device 1000 according to an exemplary embodiment of the present invention, the auxiliary electrode 303 may be disposed in the pad portion 300. The upper surface of the passivation layer 170 disposed in the peripheral area PA may be substantially flat.

While exemplary embodiments of the present invention have been described herein, it is to be understood that the present invention is not limited thereto, but, on the contrary, is intended to cover various modifications and equivalent arrangements included within the spirit and scope of the present invention.

What is claimed is:

1. A display device, comprising:
   a substrate including a display area and a peripheral area disposed at an edge of the display area;
   a transistor disposed on the display area of the substrate and comprising an interlayer insulating layer for electrical insulation between at least two electrodes of the transistor;
   a passivation layer disposed on the transistor;
   a first electrode disposed on the passivation layer;
   a pixel definition layer disposed on the passivation layer having an opening overlapping the first electrode;
   a light-emitting member disposed on the first electrode and inside the pixel definition layer;
   a second electrode disposed on the light-emitting member and the pixel definition layer; and
   a pad portion disposed on the peripheral area of the substrate,
   wherein the pad portion includes:
      a first pad electrode;
      a second pad electrode disposed adjacent to the first pad electrode; and
      an auxiliary electrode disposed between the first pad electrode and the second pad electrode,
   wherein the interlayer insulating layer having an opening disposed between the first pad electrode and the second pad electrode in a plan view, and the auxiliary electrode is disposed in the opening in the plan view, and
   wherein a plurality of first electrode particles are disposed on the auxiliary electrode and the plurality of first electrode particles include substantially the same material as the first electrode.

2. The display device of claim 1, further comprising:
   a covering layer filling the opening of the interlayer insulating layer,
   wherein the covering layer includes substantially the same material as the pixel definition layer.

3. The display device of claim 2, wherein the transistor includes:
   a semiconductor layer including a channel region, a source region, and a drain region;
   a gate insulating layer disposed on the semiconductor layer;
   a gate electrode disposed on the gate insulating layer and under the interlayer insulating layer;
   a source electrode connected to the source region and disposed on the interlayer insulating layer; and
   a drain electrode separated from the source electrode, connected to the drain region and disposed on the interlayer insulating layer,
   wherein the first pad electrode includes a lower electrode layer disposed on the gate insulating layer, and
   wherein the second pad electrode includes an upper electrode layer connected to the lower electrode layer and disposed on the interlayer insulating layer.

4. The display device of claim 3, wherein the auxiliary electrode is disposed on the gate insulating layer and includes substantially the same material as the lower electrode layer and the gate electrode, and the upper electrode layer includes substantially the same material as the source electrode and the drain electrode.

5. The display device of claim 1,
   wherein a portion of the passivation layer extends to the peripheral area, an upper surface of the portion of the passivation layer disposed on the display area is substantially flat, an upper surface of the portion of the passivation layer disposed on the peripheral area has an uneven structure, the uneven structure includes a recess portion and a convex portion, and
   wherein the pixel definition layer covers the portion of the passivation layer disposed on the peripheral area.

6. The display device of claim 5, wherein the plurality of first electrode particles are disposed on the recess portion of the uneven structure.

7. The display device of claim 6, wherein the first electrode is connected to the transistor.

8. The display device of claim 7, further comprising:
   a first wire electrically connecting the first pad electrode and the display area;
   a second wire electrically connecting the second pad electrode and the display area; and
   an auxiliary wire electrically connecting the auxiliary electrode and the first wire,
   wherein the first pad electrode is configured to receive a driving voltage.

* * * * *